United States Patent
Lin et al.

(10) Patent No.: US 7,834,361 B2
(45) Date of Patent: Nov. 16, 2010

(54) PIXEL STRUCTURE AND METHOD FOR MANUFACTURING THE SAME

(75) Inventors: Han-Tu Lin, Hsin-Chu (TW); Chien-Hung Chen, Hsin-Chu (TW)

(73) Assignee: AU Optronics, Hsin-Chu (TW)

( * ) Notice: Subject to any disclaimer, the term of this patent is extended or adjusted under 35 U.S.C. 154(b) by 0 days.

(21) Appl. No.: 12/591,019

(22) Filed: Nov. 5, 2009

(65) Prior Publication Data
US 2010/0051954 A1    Mar. 4, 2010

Related U.S. Application Data

(62) Division of application No. 12/076,681, filed on Mar. 21, 2008.

(30) Foreign Application Priority Data
Oct. 30, 2007  (TW)  ............... 96140832 A

(51) Int. Cl.
  *H01L 29/04*  (2006.01)
  *H01L 21/8238*  (2006.01)
(52) U.S. Cl. .................... 257/72; 438/210
(58) Field of Classification Search .......... 438/30, 438/171, 210, 239; 257/59, 72, E27.046–E27.121
See application file for complete search history.

(56) References Cited

U.S. PATENT DOCUMENTS

| | | | |
|---|---|---|---|
| 6,818,923 B2 | 11/2004 | Kim et al. | |
| 6,838,696 B2 | 1/2005 | Kobayashi et al. | |
| 7,001,796 B2 * | 2/2006 | Cho et al. | 438/104 |
| 2009/0108280 A1 * | 4/2009 | Jan et al. | 257/98 |

FOREIGN PATENT DOCUMENTS

CN  1632675 A  6/2005

OTHER PUBLICATIONS

Office Action of Jun. 30, 2010 for Parent U.S. Appl. No. 12/076,681.
* cited by examiner

*Primary Examiner*—Calvin Lee
(74) *Attorney, Agent, or Firm*—Bacon & Thomas, PLLC

(57) ABSTRACT

A method for manufacturing a pixel structure is provided. First, a first mask process is performed to form a patterned first metal layer on a substrate, wherein the patterned first metal layer includes a gate. Next, a second mask process is performed to form a patterned insulating layer and a patterned semiconductor layer over the gate, wherein the patterned insulating layer is disposed on the patterned first metal layer, and the patterned semiconductor layer is disposed on the patterned insulating layer. Then, a third mask process is performed to define a thin film transistor (TFT) and a pixel electrode connected thereto and to form a passivation layer to cover the TFT.

8 Claims, 9 Drawing Sheets

US 7,834,361 B2

PIXEL STRUCTURE AND METHOD FOR MANUFACTURING THE SAME

This application claims the benefit of Taiwan application Serial No. 96140832, filed Oct. 30, 2007, the subject matter of which is incorporated herein by reference.

BACKGROUND OF THE INVENTION

1. Field of the Invention

The invention relates in general to a pixel structure and a method for manufacturing the same, and more particularly to a pixel structure completed by three mask processes and a method for manufacturing the same.

2. Description of the Related Art

Along with the advance in the technology of planar display, panel manufacturers are seeking new technology to reduce manufacturing cost and further expand market demand. As TFT substrate is the critical element of the panel, how to change the manufacturing process which maintains element quality and at the same time reduces manufacturing cost has become a focus of research and development to panel manufacturers.

Conventionally, manufacturing a TFT substrate needs about four or five photomask processes. Each mask process which includes the steps of depositing material, forming photoresist, exposing, developing and etching, is not only time consuming and also incurs high material cost.

SUMMARY OF THE INVENTION

The invention is directed to a pixel structure and a method for manufacturing the same. According to the invention, the structures of TFT and signal line, and adaptor pad are completed by three mask processes, hence a lot of time and material cost are saved.

According to a first aspect of the present invention, a pixel structure including a thin film transistor (TFT) and a pixel electrode is provided. The TFT disposed on a substrate includes a gate, an insulating layer, a semiconductor layer, a source and a drain. The insulating layer is disposed over the gate. The semiconductor layer is disposed on the insulating layer. The source and the drain are disposed on the semiconductor layer. The pixel electrode is disposed on the substrate and is electrically connected to the TFT. The pixel electrode is a polycrystalline metal oxide.

According to a second aspect of the present invention, a method for manufacturing a pixel structure is provided. First, a first mask process is performed to form a patterned first metal layer on a substrate, wherein the patterned first metal layer includes a gate. Next, a second mask process is performed to form a patterned insulating layer and a patterned semiconductor layer over the gate, wherein the patterned insulating layer is disposed on the patterned first metal layer, and the patterned semiconductor layer is disposed on the patterned insulating layer. Then, a third mask process is performed to define a thin film transistor (TFT) and a pixel electrode connected thereto and to form a passivation layer to cover the TFT According to a third aspect of the present invention, a method for manufacturing a pixel structure is provided. First, a substrate having a pixel region is provided. Next, a patterned first metal layer is formed on the substrate. Then, an insulating layer and a semiconductor layer are formed, wherein the insulating layer is disposed on the patterned first metal layer within the pixel region, and the semiconductor layer is disposed on the insulating layer. Next, an oxidized metal layer is formed on the substrate to cover the patterned first metal layer, the semiconductor layer, and the insulating layer. Then, a second metal layer is formed on the oxidized metal layer. Next, the oxidized metal layer and the second metal layer are patterned by a halftone mask or a gray-tone mask to form a thin film transistor (TFT), and a data line and a pixel electrode that are coupled to the TFT. Then, a photoresist material is reflowed to form a passivation layer which covers the TFT and the data line.

The invention will become apparent from the following detailed description of the preferred but non-limiting embodiments. The following description is made with reference to the accompanying drawings.

DETAILED DESCRIPTION OF THE INVENTION

Figure 1:
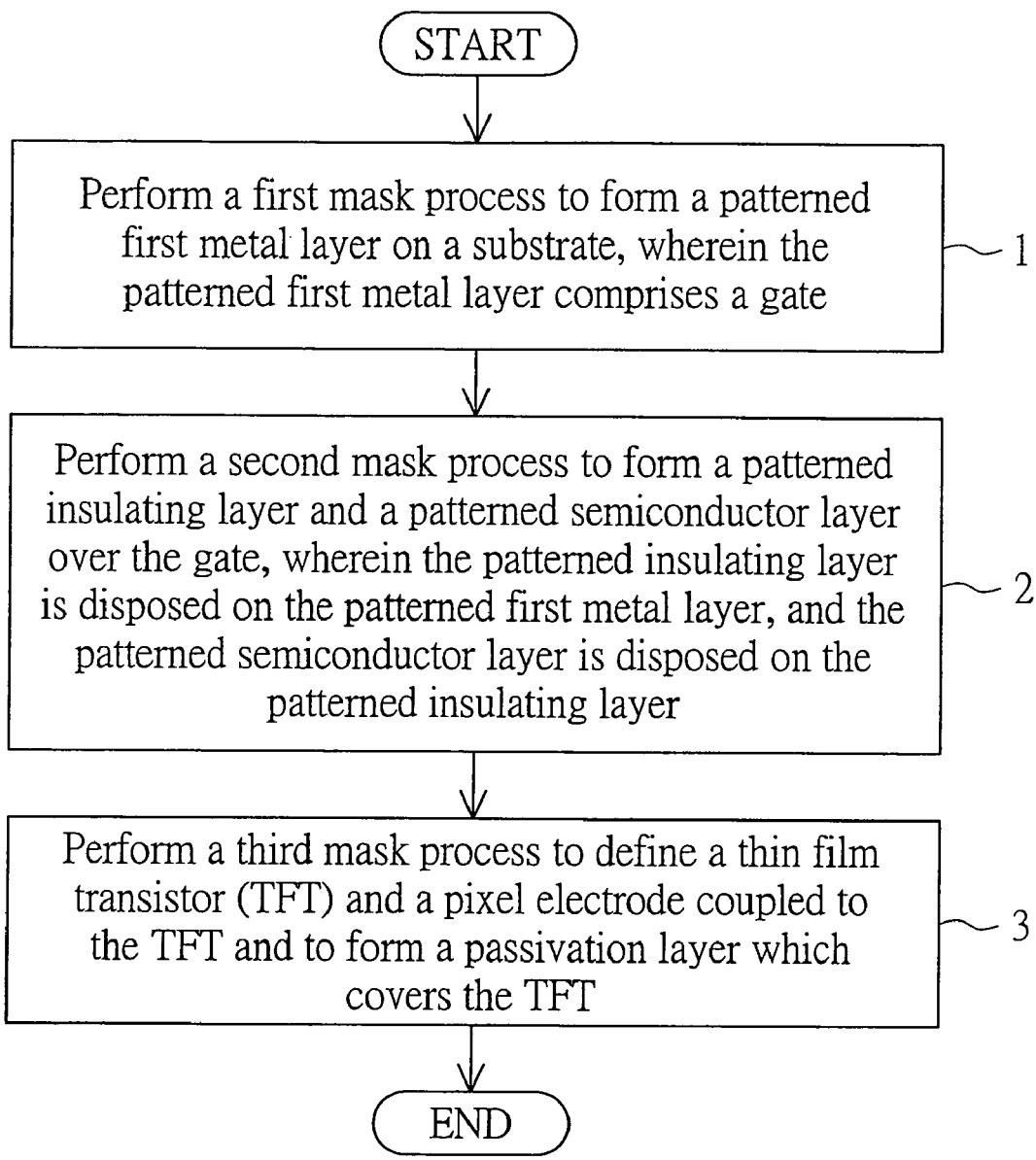
FIG. 1 is a method of manufacturing a pixel structure of the invention.
Figure 2A:
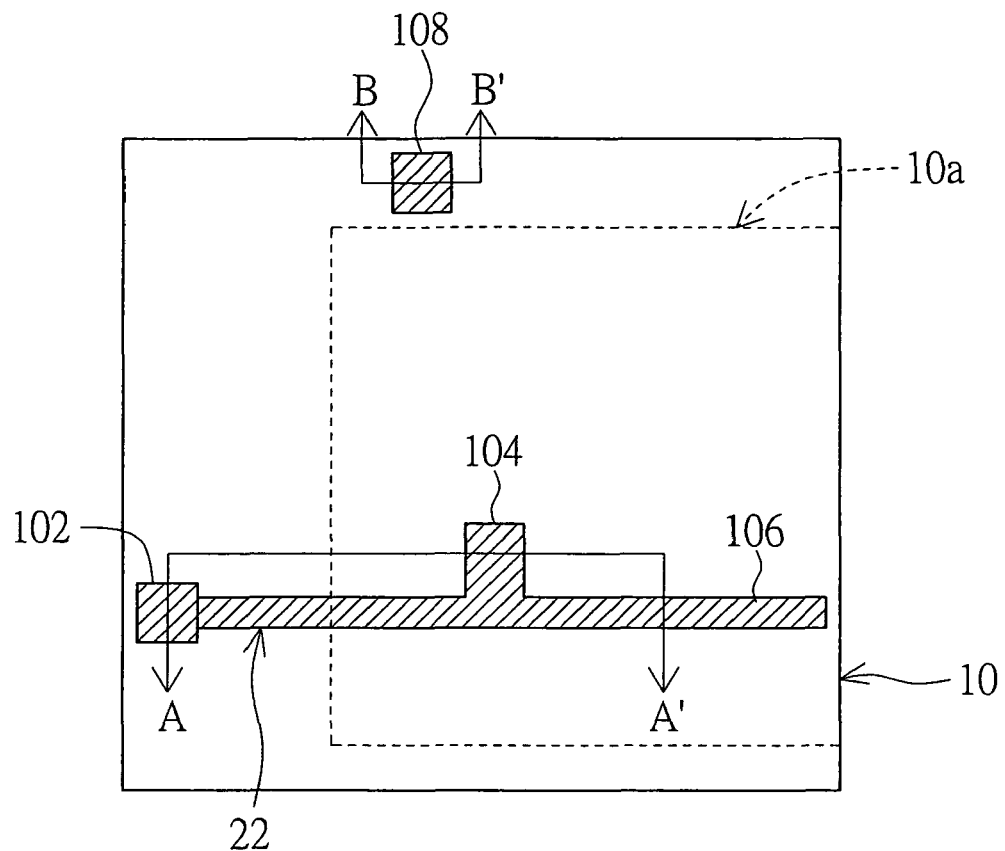
FIG. 2A is a planar diagram of the first mask process of a method of manufacturing a pixel structure according to a preferred embodiment of the invention.
Figure 2B:
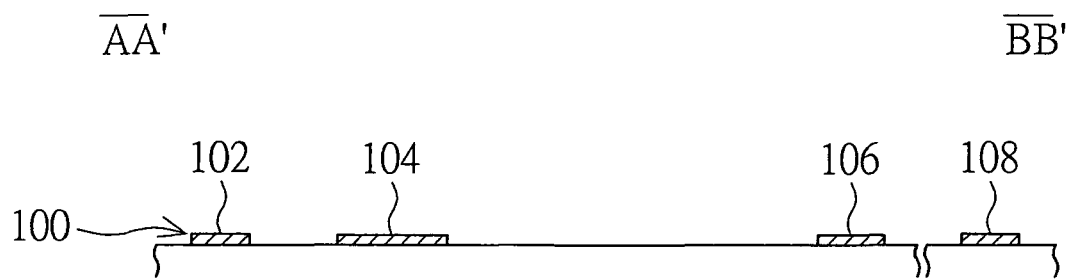
FIG. 2B are cross-sectional views along the cross-sectional lines AA' and BB' of FIG. 2A.

Referring to FIG. 1, a method of manufacturing a pixel structure of the invention is shown. Also, referring to FIGS. 2A and 2B. FIG. 2A is a planar diagram of the first mask process of a method of manufacturing a pixel structure according to a preferred embodiment of the invention. FIG. 2B are cross-sectional views along the cross-sectional lines AA' and BB' of FIG. 2A. Referring to FIG. 2A. As indicated in step 1, a first mask process is performed, a substrate 10 having a pixel region 10a is provided to form a patterned first metal layer 100 on the substrate 10. The first mask process as indicated in FIG. 2B includes the following steps. First, a first metal layer (not illustrated) is deposited on the substrate 10. Next, a first patterned photoresist layer (not illustrated) is formed on the first metal layer. Then, the first patterned photoresist layer is used as a photomask, and the first metal layer is etched to form a patterned first metal layer 100 on the substrate 10. As indicated in FIG. 2A, the patterned first metal layer 100 includes a scan line 22, a gate 104 and a scan pad 102 both coupled to the scan line 22, a data pad 108, and a first electrode 106.

Figure 3A:
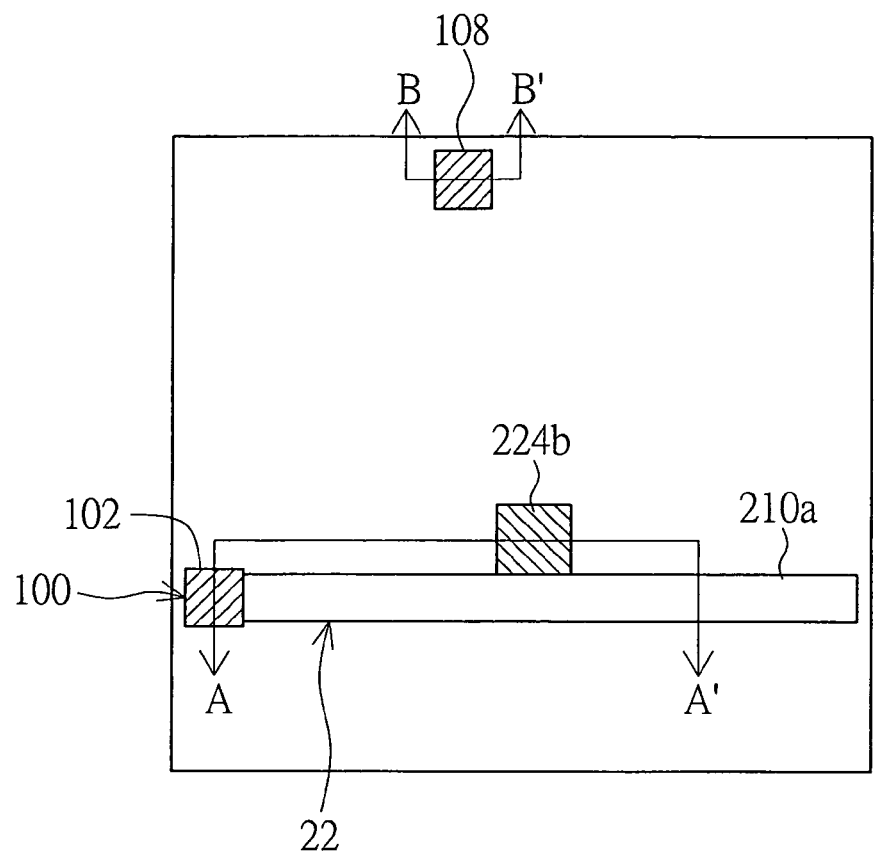
FIG. 3A is a planar diagram of the second mask process of a method of manufacturing a pixel structure according to a preferred embodiment of the invention.
Figure 3B:
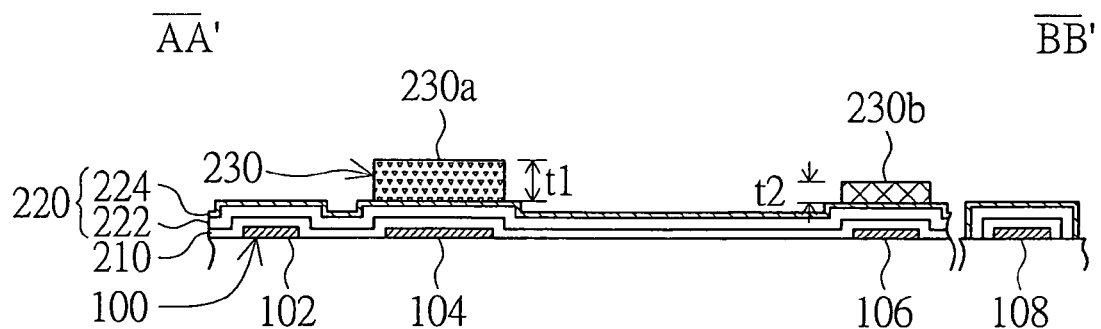
FIGS. 3B-3E are cross-sectional views along the cross-sectional lines AA' and BB' of FIG. 3A.

Referring to FIGS. 3A-3E. FIG. 3A is a planar diagram of the second mask process of a method of manufacturing a pixel structure according to a preferred embodiment of the invention. FIG. 3B-3E are cross-sectional views along the cross-sectional lines AA' and BB' of FIG. 3A. Referring to FIG. 3B, first, an insulating material layer 210 is deposited on the patterned first metal layer 100. Next, a semiconductor material layer 220 is deposited on the insulating material layer 210, wherein the semiconductor material layer 220 includes a semiconductor channel layer 222 and an Ohm contact layer 224, the material of the semiconductor channel layer 222 is amorphous silicon, and the material of the Ohm contact layer 224 is n-type amorphous silicon. Then, a second patterned photoresist layer 230 is formed on the semiconductor material layer 220. The second patterned photoresist layer 230 is formed by a halftone mask or a gray-tone mask and includes a second patterned photoresist layer 230a having a thickness t1 and a second patterned photoresist layer 230b having a thickness t2, wherein the second patterned photoresist layer 230a and the second patterned photoresist layer 230b are respectively disposed over the gate 104 and the first electrode 106, and the thickness t1 is larger than the thickness t2.

Figure 3C:
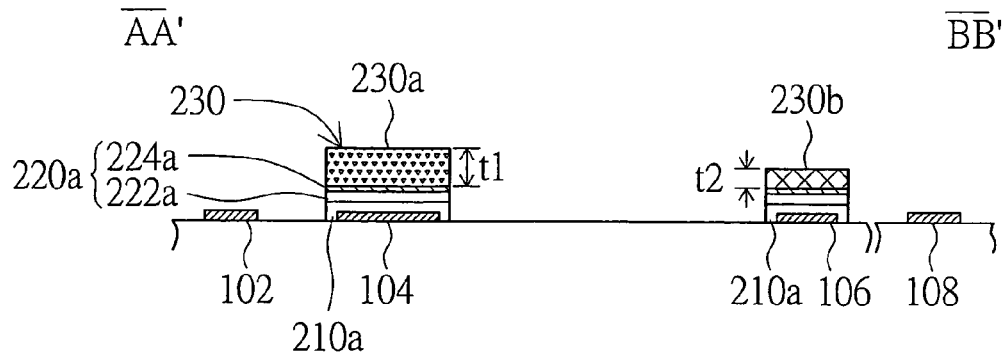

Referring to FIG. 3C. Next, the second patterned photoresist layer 230 is used as a photomask, and the semiconductor layer 220 and the insulating material layer 210 are etched to form a patterned insulating layer 210a and a patterned semiconductor layer 22a over the gate 104 and the first electrode 106 respectively, wherein the patterned semiconductor layer 220a includes a semiconductor channel layer 222a and an Ohm contact layer 224a.

Figure 3D:
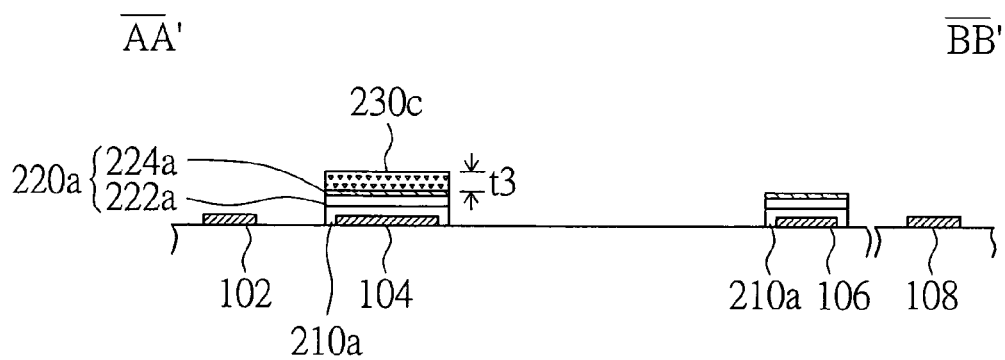

Referring to FIG. 3D. Then, the thickness of the second patterned photoresist layer 230 is reduced by ashing process until the second patterned photoresist layer 230b having the thickness t2 is completely removed to exposed part of the patterned semiconductor layer disposed over the first electrode 106 of the scan line 22 and leave part of the second patterned photoresist layer 230c with a thickness t3 disposed on the semiconductor layer 220a over the gate 104.

Figure 3E:
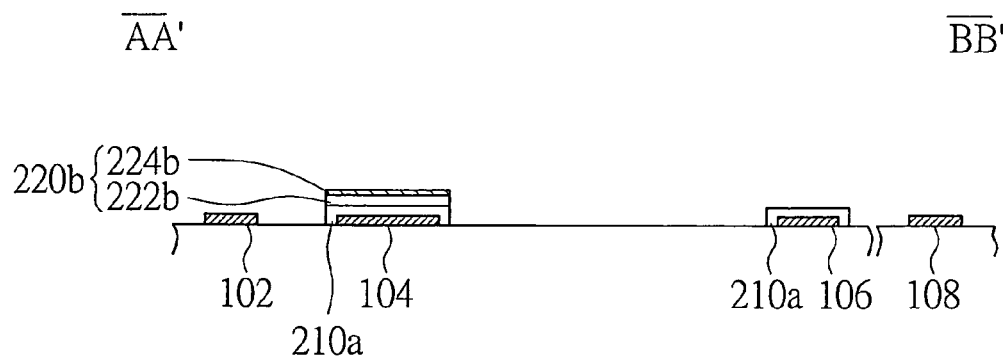

Next, the patterned semiconductor layer exposed on the scan line 22 (the first electrode 106) is etched to expose the patterned insulating layer 210a as indicated in FIG. 3E. Then, the remaining second patterned photoresist layer 230c is removed to form a patterned semiconductor layer 220b over the gate 104 as indicated in FIG. 3E and FIG. 3A, wherein the patterned semiconductor layer 220b includes an Ohm contact layer 224b and a semiconductor channel layer 222b. As indicated in the step 2 of FIG. 1, in the second mask process, a patterned insulating layer 210a and a patterned semiconductor layer 220b are formed, wherein the patterned insulating layer 210a is disposed on part of the patterned first metal layer 100, and the patterned semiconductor layer 220b is disposed on the patterned insulating layer 210a over the gate 104.

Figure 4A:
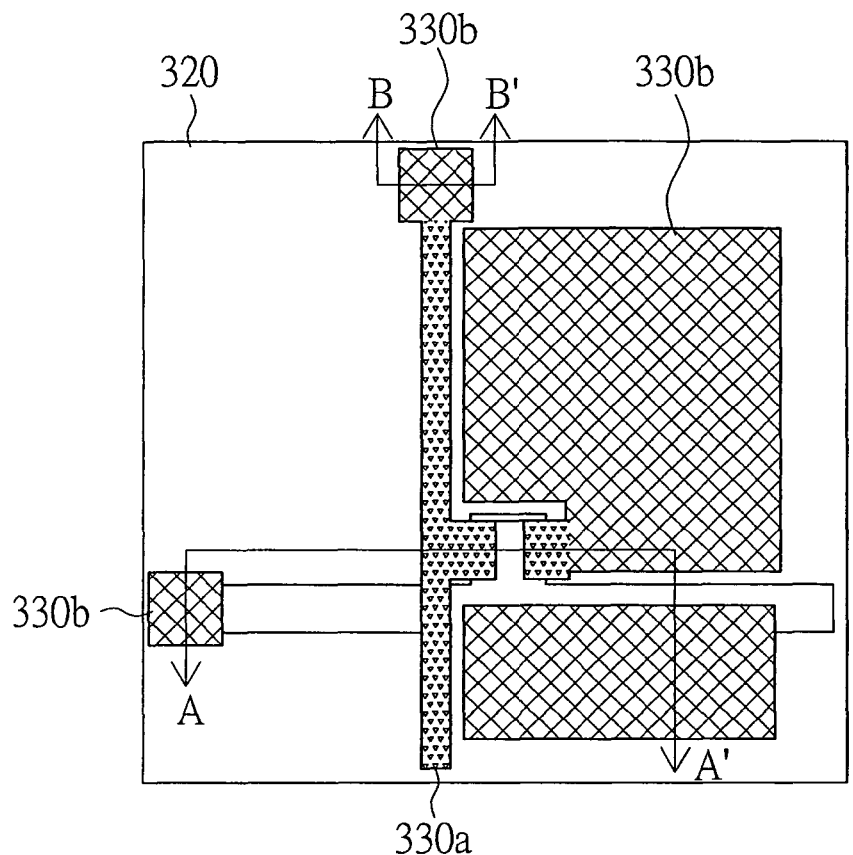
FIG. 4A is a planar diagram of the first step of the third mask process of a method of manufacturing a pixel structure according to a preferred embodiment of the invention.
Figure 4B:
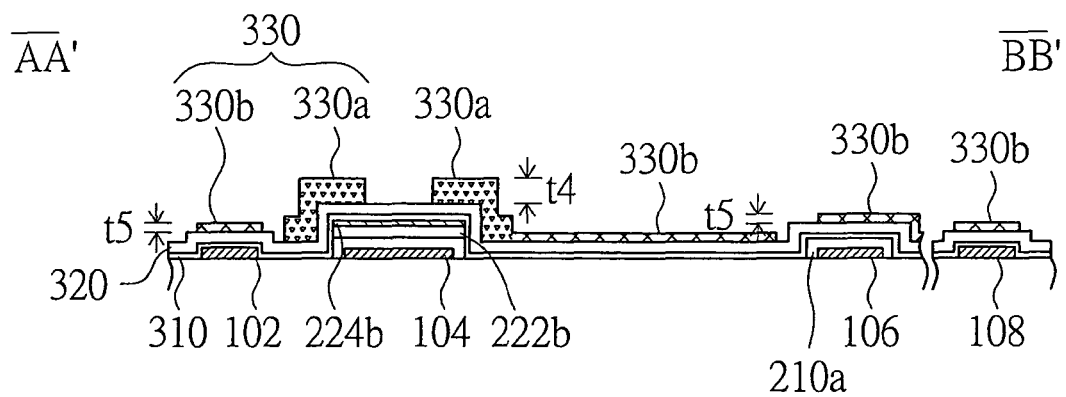
FIG. 4B are cross-sectional views of manufacturing process along the cross-sectional lines AA' and BB' of FIG. 4A.

Referring to FIG. 4A and 4B. FIG. 4A is a planar diagram of the first step of the third mask process of a method of manufacturing a pixel structure according to a preferred embodiment of the invention. FIG. 4B is a cross-sectional view of manufacturing process along the cross-sectional lines AA' and BB' of FIG. 4A. Referring to FIG. 4B. First, an oxidized metal layer 310 is formed on the patterned first metal layer 100, the Ohm contact layer 224b of the patterned semiconductor layer 220b, and the patterned insulating layer 210a. Preferably, the material of the oxidized metal layer 310 is indium tin oxide (ITO). Next, a second metal layer 320 is formed on the oxidized metal layer 310. Then, a third patterned photoresist layer 330 is formed on the second metal layer 320 by a halftone mask or a gray-tone mask, wherein the third patterned photoresist layer 330 includes a third patterned photoresist layer 330a having a thickness t4 and a third patterned photoresist layer 330b having a thickness t5, and the thickness t4 is larger than the thickness t5. As indicated in FIG. 4A, the third patterned photoresist layer 330b, which is thinner, covers a predetermined region of pixel electrode, a scan pad 102 and a data pad 108, and the third patterned photoresist layer 330a, which is thicker, covers a predetermined region of data line, and a source and a drain of TFT.

Figure 5A:
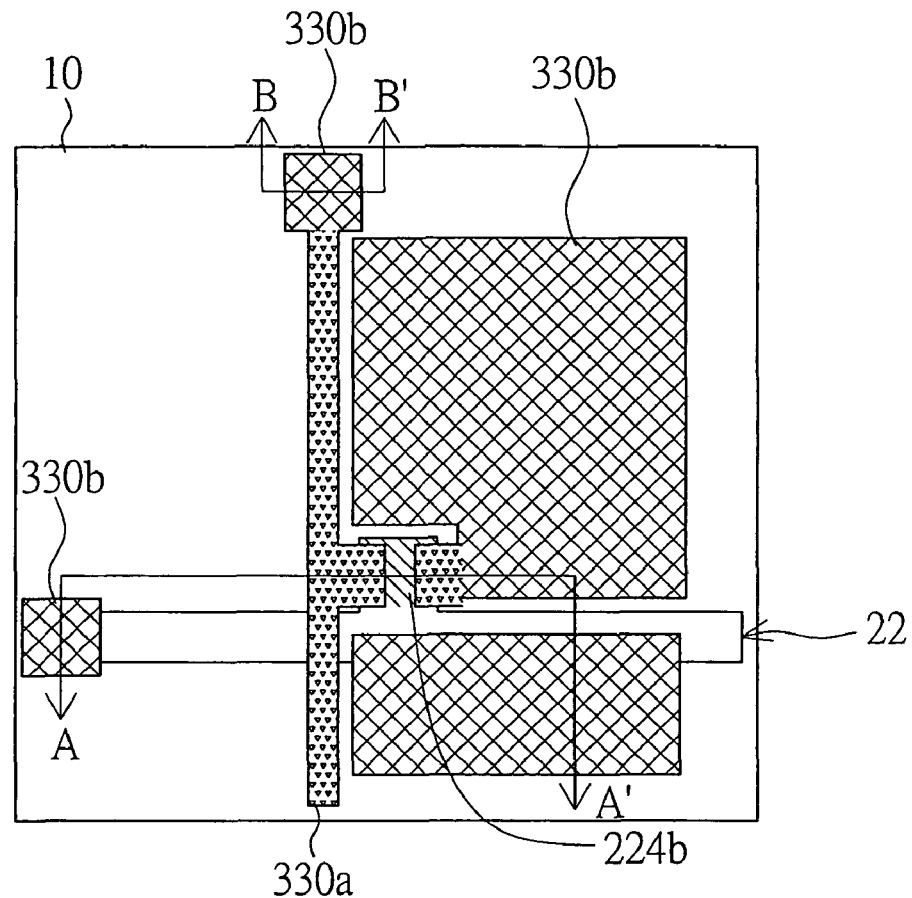
FIG. 5A is a planar diagram of the second step of the third mask process of a method of manufacturing a pixel structure according to a preferred embodiment of the invention.
Figure 5B:
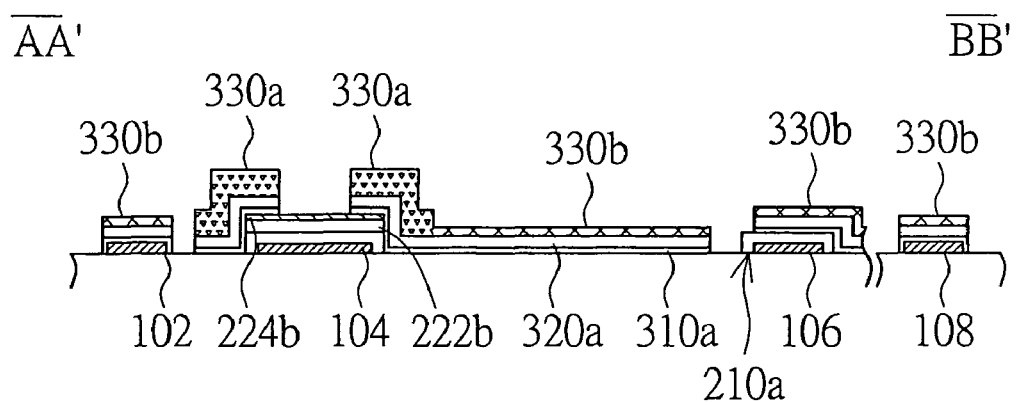
FIG. 5B are cross-sectional views of manufacturing process along the cross-sectional lines AA' and BB' of FIG. 5A.

Referring to FIG. 5A and 5B. FIG. 5A is a planar diagram of the second step of the third mask process of a method of manufacturing a pixel structure according to a preferred embodiment of the invention. FIG. 5B is a cross-sectional view of manufacturing process along the cross-sectional lines AA' and BB' of FIG. 5A. Referring to FIG. 5B, first, the third patterned photoresist layer 330 is used as a photomask and the second metal layer 320 and oxidized metal layer 310 are etched as a patterned second metal layer 320a and a patterned oxidized metal layer 310a to expose part of the Ohm contact layer 224b over the gate 104.

Figure 6A:
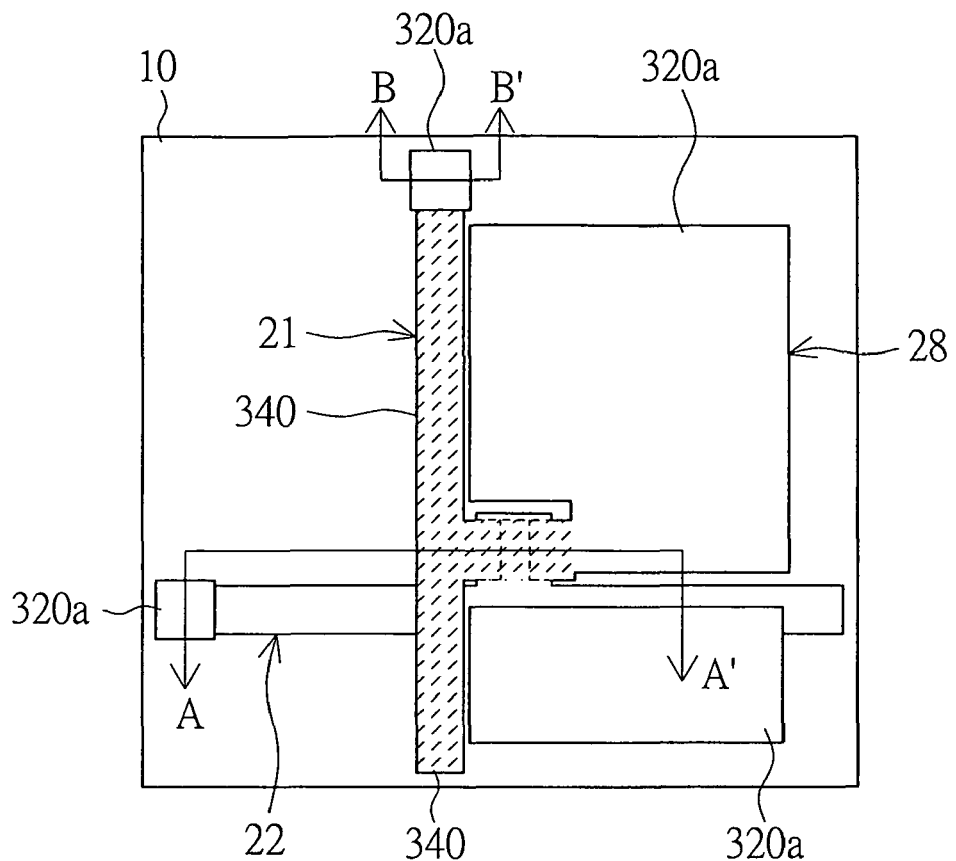
FIG. 6A is a planar diagram of the third step of the third mask process of a method of manufacturing a pixel structure according to a preferred embodiment of the invention.
Figure 6B:
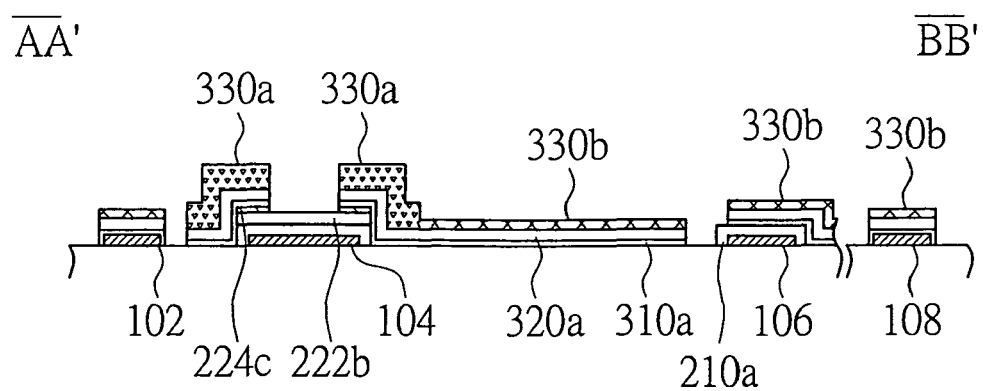
FIG. 6B-6D are cross-sectional views of manufacturing process along the cross-sectional lines AA' and BB' of FIG. 6A.
Figure 6C:
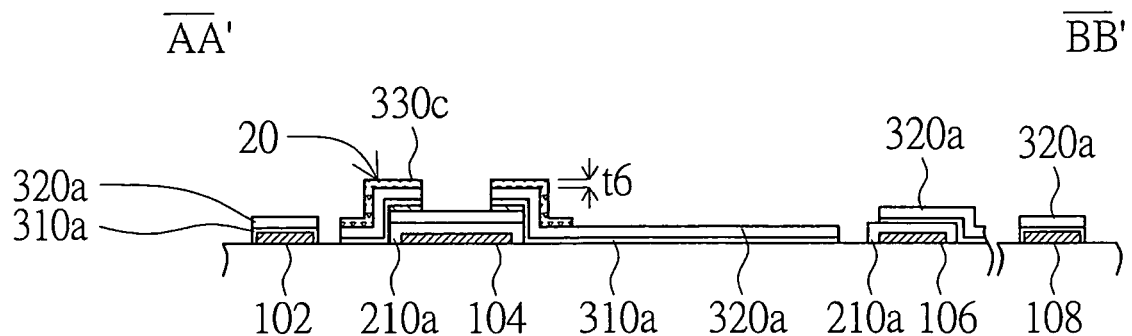
Figure 6D:
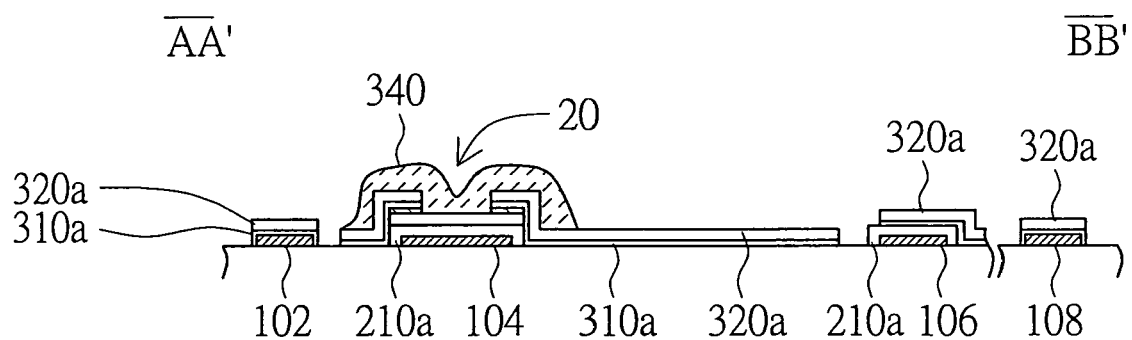

Referring to FIG. 6A-6D. FIG. 6A is a planar diagram of the third step of the third mask process of a method of manufacturing a pixel structure according to a preferred embodiment of the invention. FIGS. 6B-6D are cross-sectional views of manufacturing process along the cross-sectional lines AA' and BB' of FIG. 6A. Referring to FIG. 6B, first, the exposed part of the Ohm contact layer 224b is etched to form an Ohm contact layer 224c and expose the semiconductor channel layer 222b.

Referring to FIG. 6C. Next, the thickness of the third patterned photoresist layer 330 is reduced by ashing process until the third patterned photoresist layer 330b having thickness t5 is completely removed to expose the pixel electrode region 28, the scan pad 102, and the patterned second metal layer 320a over the data pad 108, and leave the third patterned photoresist layer 330c having a thickness t6. As indicated in FIG. 6A, a TFT 20 and a data line 21 coupled thereto, and a pixel electrode region 28 including a second metal layer 320a and an oxidized metal layer 310a are formed.

Referring to FIG. 6D. Then, the remaining third patterned photoresist layer 330c is melted by heat to reflow and form a passivation layer 340. The passivation layer 340 covers the TFT 20 and the data line 21.

Figure 7A:
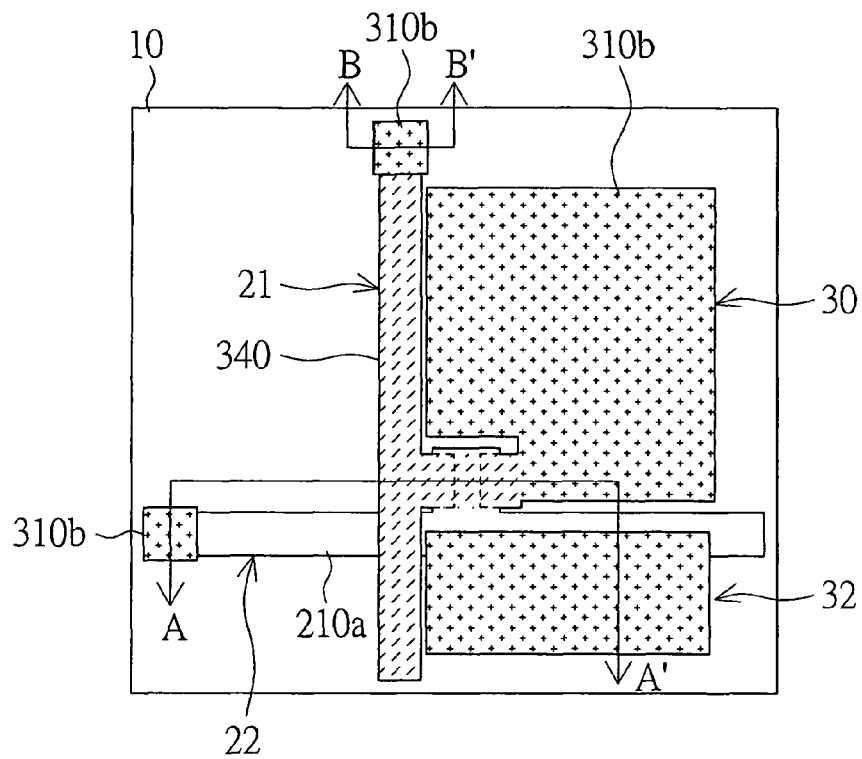
FIG. 7A is a planar diagram of the fourth step of the third mask process of a method of manufacturing a pixel structure according to a preferred embodiment of the invention.
Figure 7B:
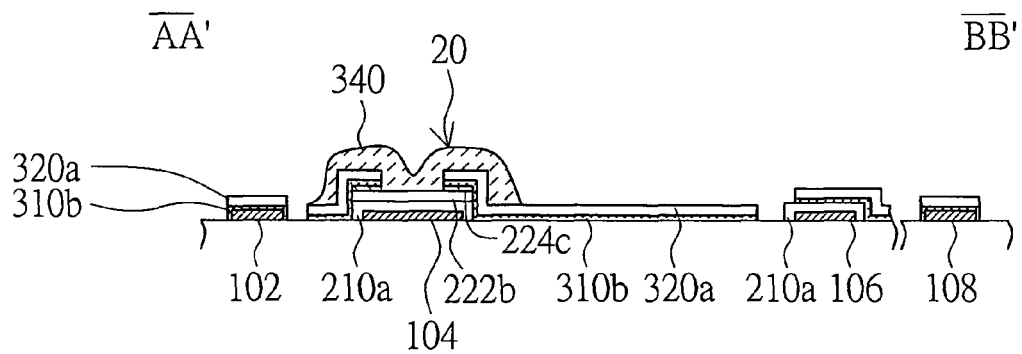
FIGS. 7B-7C are cross-sectional views of manufacturing process along the cross-sectional lines AA' and BB' of FIG. 7A.
Figure 7C:
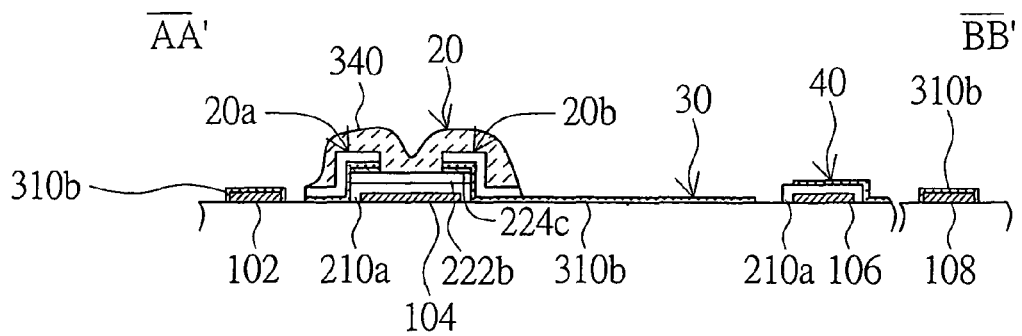

Referring to FIGS. 7A-7C. FIG. 7A is a planar diagram of the fourth step of the third mask process of a method of manufacturing a pixel structure according to a preferred embodiment of the invention. FIGS. 7B-7C are cross-sectional views of manufacturing process along the cross-sectional lines AA' and BB' of FIG. 7A. Referring to FIG. 7B. First, the oxidized metal layer 310a is crystallized as a polycrystalline metal oxide 310b, wherein the temperature for crystallizing the oxidized metal layer 310a is higher than 200□.

Referring to FIG. 7C. Next, the exposed part of the patterned second metal layer 320a is etched to expose polycrystalline pixel electrodes 30 and 32, wherein the pixel electrode 32 partly covers the insulating layer 210a of the scan line 22. Also, referring to FIG. 7A. A storage capacitor is constructed by the first electrode 106, the insulating layer 210a and a second electrode 40, wherein the second electrode 40 is part of another pixel electrode 32. The TFT 20 includes the gate 104, the insulating layer 210a, the semiconductor channel layer 222b, the Ohm contact layer 224c, and the source 20a and the drain 20b. The insulating layer 210a is disposed over the gate 104. The semiconductor channel layer 222b and the Ohm contact layer 224c are disposed on the insulating layer 210a. The source 20a and the drain 20b are disposed on the Ohm contact layer 224c. The pixel electrode 30 is electrically connected to TFT 20. The scan line 22 is electrically connected to the gate 104. The data line 21 is electrically connected to the source 20a. The data line 21 is formed by part of the second metal layer and part of polycrystalline oxidized metal layer, and the passivation layer 340 formed by a photoresist material also covers the data line 21. The TFT 20 also includes a polycrystalline oxidized metal layer disposed between the Ohm contact layer 224c and the source 20a and the drain 20b. The polycrystalline oxidized metal layer at the drain 20b is electrically connected to the pixel electrode 30, and the polycrystalline oxidized metal layer and the pixel electrode 30 at the drain 20b is formed by the same film layer. The pixel structure of the invention includes polycrystalline conductive material, hence having better conductivity than conventional pixel structure. Refer to both FIG. 7A and FIG. 7C. As indicated in the step 3 of FIG. 1, in the third mask process, the TFT 20 as well as the pixel electrode 30 coupled to the TFT 20, and the second electrode 40 are defined, and the passivation layer 340 is formed to cover the TFT 20.

According to the pixel structure and the method for manufacturing the same disclosed in the above embodiment of the invention, only three mask processes are required to complete the structures of TFT and signal line, and signal line adaptor pad of a pixel structure. As the manufacturing process of the invention saves a lot of time and material, the overall manufacturing cost and manufacturing time are reduced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A pixel structure, comprising:
   a thin film transistor (TFT) disposed on a substrate, wherein the TFT comprises:
   a gate;
   an insulating layer disposed over the gate;
   a semiconductor layer disposed on the insulating layer; and
   a source and a drain disposed on the semiconductor layer; and
   a pixel electrode disposed on the substrate and electrically connected to the TFT, wherein the pixel electrode is a polycrystalline metal oxide a data line formed by a metal layer and an oxidized metal layer, wherein the data line is electrically connected to the source, and the metal layer is disposed on the data oxidized metal layer.

2. The pixel structure according to claim 1, wherein the semiconductor layer comprises a semiconductor channel layer and an Ohm contact layer.

3. The pixel structure according to claim 1, wherein the TFT further comprises an oxidized metal layer disposed between the semiconductor layer and the source and the drain, the drain is electrically connected to the pixel electrode via the oxidized metal layer.

4. The pixel structure according to claim 3, wherein the oxidized metal layer and the pixel electrode are constructed from the same film layer.

5. The pixel structure according to claim 3, wherein the material of the oxidized metal layer and the pixel electrode is indium tin oxide (ITO).

6. The pixel structure according to claim 1, further comprising a passivation layer, wherein the passivation layer is a photoresist material and covers the TFT.

7. The pixel structure according to claim 1, further comprising a scan line electrically connected to the gate, wherein the insulating layer is disposed on the scan line, and the pixel electrode partly covers the insulating layer disposed on the scan line to form a capacitor.

8. The pixel structure according to claim 1, further comprising a passivation layer, wherein the passivation layer is a photoresist material and covers the data line.

* * * * *

UNITED STATES PATENT AND TRADEMARK OFFICE
CERTIFICATE OF CORRECTION

| | | |
|---|---|---|
| PATENT NO. | : 7,834,361 B2 | Page 1 of 1 |
| APPLICATION NO. | : 12/591019 | |
| DATED | : November 16, 2010 | |
| INVENTOR(S) | : Lin et al. | |

It is certified that error appears in the above-identified patent and that said Letters Patent is hereby corrected as shown below:

Please correct the following on the face of the above identified Patent.

Item (73) Assignee should read: AU Optronics <u>Corp.</u>, Hsin-Chu (TW)

Signed and Sealed this
Thirty-first Day of May, 2011

David J. Kappos
*Director of the United States Patent and Trademark Office*